United States Patent
Ego (10) Patent No.: US 10,110,179 B2
(45) Date of Patent: Oct. 23, 2018

(54) AUDIO CIRCUIT

(71) Applicant: ROHM CO., LTD., Ukyo-ku, Kyoto (JP)

(72) Inventor: Hirotsugu Ego, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 1 day.

(21) Appl. No.: 15/292,571

(22) Filed: Oct. 13, 2016

(65) Prior Publication Data

US 2017/0111735 A1     Apr. 20, 2017

(30) Foreign Application Priority Data

Oct. 14, 2015   (JP) .................................. 2015-203166

(51) Int. Cl.
*H03F 99/00*     (2009.01)
*H03F 3/213*     (2006.01)
(Continued)

(52) U.S. Cl.
CPC ............ *H03F 3/213* (2013.01); *H03F 1/0216* (2013.01); *H03F 1/34* (2013.01); *H03F 3/187* (2013.01);
(Continued)

(58) Field of Classification Search
CPC ..... H03F 2200/375; H03F 2203/45042; H03F 2203/45044; H03F 2203/45152;
(Continued)

(56) References Cited

U.S. PATENT DOCUMENTS

| | | | |
|---|---|---|---|
| 6,459,335 B1 * | 10/2002 | Darmawaskita | H03F 3/45977 327/124 |
| 8,687,821 B2 * | 4/2014 | Schuurmans | H03F 1/305 330/100 |
| 9,813,034 B2 * | 11/2017 | Wang | H03G 1/0035 |

FOREIGN PATENT DOCUMENTS

| | | | |
|---|---|---|---|
| JP | 09148930 A | * | 6/1997 |
| JP | 2008278117 A | | 11/2008 |

OTHER PUBLICATIONS

Richard Palmer, DC Parameters: Input Offset Voltage (VIO), Application Report SLOA059 from Texas Instruments, 2001, pp. 1-24.*

(Continued)

*Primary Examiner* — Duc Nguyen
*Assistant Examiner* — Kile Blair
(74) *Attorney, Agent, or Firm* — Cantor Colburn LLP (57) ABSTRACT

An audio amplifier includes an operational amplifier, a replica of an output stage of the operational amplifier, and a feedback circuit configured such that, in a normal mode, an output signal of the operational amplifier is fed back to the input side of the operational amplifier, and such that, in a calibration mode, an output signal of the replica is fed back to the input side of the operational amplifier. The calibration circuit cancels out the offset voltage of the audio amplifier. An adjustment circuit changes the offset of the audio amplifier according to a control signal S1. A control circuit adjusts the control signal such that an output signal $V_S$ of the replica is within a predetermined target range in a state in which a predetermined voltage is input to the audio amplifier. Memory stores the control signal S2 acquired in the final stage.

15 Claims, 9 Drawing Sheets

(51) Int. Cl.
  *H03F 3/187* (2006.01)
  *H03F 1/34* (2006.01)
  *H03F 1/02* (2006.01)
  *H04R 3/00* (2006.01)
  *H04R 5/04* (2006.01)

(52) U.S. Cl.
  CPC ........... *H04R 3/00* (2013.01); *H03F 2200/03* (2013.01); *H03F 2200/129* (2013.01); *H03F 2200/504* (2013.01); *H04R 5/04* (2013.01)

(58) Field of Classification Search
  CPC . H03F 2203/45212; H03F 2203/45214; H03F 3/45928; H03F 3/45968; H03F 3/45973; H03F 3/45977; H03F 3/45991; H03F 3/45995; H03F 2200/03; H03F 3/187; H03F 3/45596; H03F 3/456; H03F 3/45605; H03F 3/45627; H03F 3/45744; H03F 3/45748; H03F 3/45753; H03F 3/45775; H03F 3/45892; H03F 3/45896; H03F 3/45901; H03F 3/45923
  See application file for complete search history.

(56) References Cited

OTHER PUBLICATIONS

Tong Xingyuan, Zhu Zhangming and Yang Yintang, "An offset cancellation technique in a switched-capacitor comparator for SAR ADCs," IEEE Journal of Semiconductors, vol. 33, No. 1, pp. 015011-1-015011-5, Jan. 2012.*

* cited by examiner

AUDIO CIRCUIT

CROSS-REFERENCE TO RELATED APPLICATIONS

The present invention claims priority under 35 U.S.C. § 119 to Japanese Application No. 2015-203166, filed Oct. 14, 2015, the entire content of which is incorporated herein by reference.

BACKGROUND OF THE INVENTION

1. Field of the Invention

The present invention relates to an audio circuit.

2. Description of the Related Art

Figure 1:
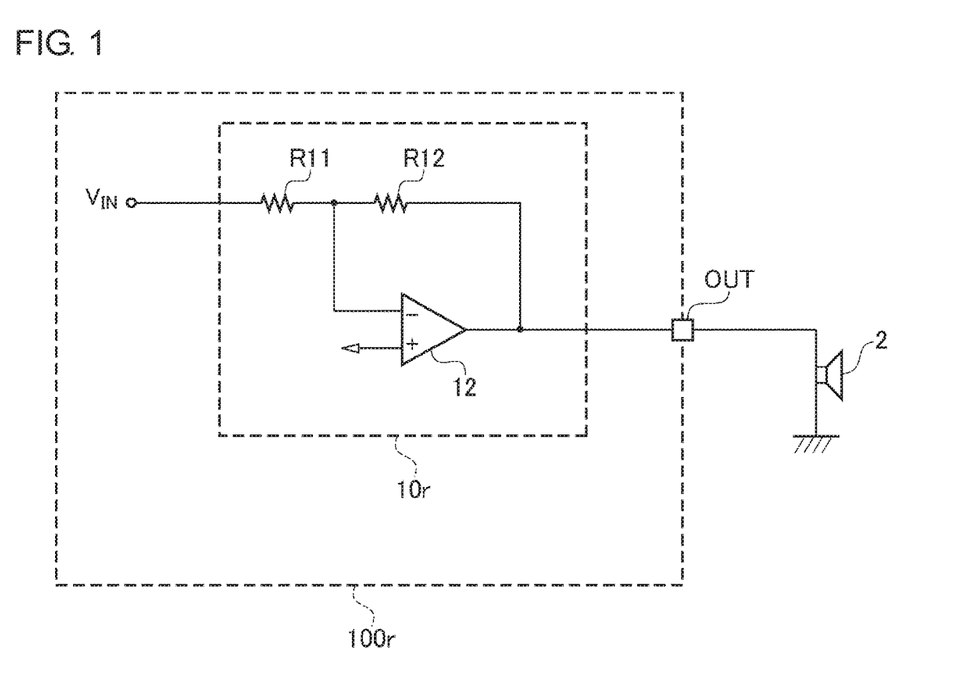
FIG. 1 is a circuit diagram showing an audio circuit investigated by the present inventor.

In order to drive an electroacoustic conversion element such as headphones, speakers, or the like, an audio amplifier is employed. FIG. 1 is a circuit diagram showing an audio circuit investigated by the present inventor. An audio circuit $100r$ includes an audio amplifier 10. The audio amplifier 10 amplifies an analog audio signal (which will also be referred to as the "input voltage") $V_{IN}$ so as to supply an output voltage $V_{OUT}$ to an electroacoustic conversion element 202 connected to an output terminal OUT.

The audio amplifier 10 shown in FIG. 1 is configured as an inverting amplifier including an operational amplifier 12 and resistors R11 and R12. The audio amplifier 10 amplifies the input voltage $V_{IN}$. The input voltage $V_{IN}$ is configured as the sum total of the DC component $V_{DC}$ and the AC component (audio component) $V_{AC}$. For simplicity of description and ease of understanding, description will be made assuming that $V_{DC}=0$, and accordingly, that the audio signal $V_{IN}$ changes between a positive value and a negative value with 0 V as its center. The operational amplifier 12 is arranged such that a bias voltage $V_B=0$ V is supplied to its non-inverting input terminal. Assuming that the operational amplifier 12 is an ideal operational amplifier having no input offset voltage $V_{OFS}$ the output voltage $V_{OUT}$ is represented by the following Expression (1).

$$V_{OUT}=-R12/R11 \times V_{IN} \qquad (1)$$

In actuality, the operational amplifier 12 has such an input offset voltage $V_{OFS}$. In this case, the output voltage $V_{OUT}$ is represented by the following Expression (2).

$$V_{OUT}=-V_{OFS}=R12/R11 \times (V_{IN}+V_{OFS}) \qquad (2)$$

Accordingly, when the audio circuit $100r$ is started up, the output voltage $V_{OUT}$ changes toward a voltage represented by $(-V_{OFS}-R12/R11 \times V_{OFS})$ even if the input voltage $V_{IN}$ is zero, i.e., even in a silent state. This leads to a problem of noise (which will also be referred to as "pop noise") output from the electroacoustic conversion element 202.

In order to suppress such pop noise, an approach is conceivable in which, in the manufacturing process, the offset voltage $V_{OFS}$ of the operational amplifier is adjusted by means of an adjustment method such as laser trimming or the like such that the offset voltage $V_{OFS}$ approaches zero. For example, the operational amplifier 12 is configured such that the bias current that flows through its differential input stage can be adjusted. Such an arrangement allows the offset voltage $V_{OFS}$ to be adjusted such that it becomes zero by means of laser trigging.

Typically, the trimming step is performed before the assembly step. However, in some cases, the offset voltage $V_{OFS}$ of the operational amplifier changes due to stress applied from an LSI package. Accordingly, in a case in which the offset voltage is adjusted such that it matches zero before the assembly step in a state in which the operational amplifier remains on a wafer, such an operational amplifier has the potential to have a non-zero offset voltage. Accordingly, with such an operational amplifier, pop noise can potentially occur.

Furthermore, the offset voltage $V_{OFS}$ depends on the power supply voltage supplied to the operational amplifier. Accordingly, in a case in which there is a difference between the power supply voltage supplied in the trimming step and the power supply voltage in actual use, such an arrangement has a problem of offset voltage in actual use. Accordingly, with such an operational amplifier, pop noise can potentially occur.

SUMMARY OF THE INVENTION

The present invention has been made in order to solve such a problem. Accordingly, it is an exemplary purpose of an embodiment of the present invention to provide an audio circuit that is capable of suppressing pop noise.

An embodiment of the present invention relates to an audio circuit. The audio circuit comprises an audio amplifier and a calibration circuit that cancels out an offset voltage of the audio amplifier in a calibration mode. The audio amplifier comprises: an operational amplifier; a replica circuit configured as a replica of an output stage of the operational amplifier; and a feedback circuit configured such that, in a normal mode, an output signal of the operational amplifier is fed back to an input side of the operational amplifier, and such that, in the calibration mode, an output signal of the replica circuit is fed back to the input side of the operational amplifier. The calibration circuit comprises: an adjustment circuit that changes an offset of the audio amplifier according to a control signal; a control circuit that adjusts the control signal in the calibration mode such that the output signal of the replica circuit is within a predetermined target range in a state in which a predetermined voltage is input to the audio amplifier; and a register that holds the control signal acquired in a final stage of the calibration mode.

By providing and employing the replica circuit configured as a replica of the output stage of the operational amplifier, such an arrangement allows the calibration to be performed without transmitting a change in the signal to the output terminal of the audio circuit. This allows the calibration to be performed without noise generation before the audio signal is played back in a state in which the audio circuit is assembled in the form of a set. Furthermore, by performing the calibration in such a state in which the audio circuit is assembled in the form of a set, such an arrangement is capable of removing the effect of stress due to packaging and the effect of the power supply voltage. Thus, such an arrangement is capable of suppressing pop noise as compared with offset canceling using laser trimming.

Also, the audio amplifier may be configured as an inverting amplifier. Also, the adjustment circuit may change a reference voltage applied to a non-inverting input terminal of the operational amplifier.

Also, the audio amplifier may be configured as a non-inverting amplifier. Also, the feedback circuit may divide a voltage difference between a reference voltage and an output signal of the operational amplifier or otherwise the replica circuit with a predetermined voltage dividing ratio. Also, the feedback circuit may output the voltage thus divided to a non-inverting input terminal of the operational amplifier. Also, the adjustment circuit may change the reference voltage.

Also, the adjustment circuit may divide the predetermined voltage so as to generate the reference voltage. Also, the adjustment circuit may have a variable voltage dividing ratio that is changed according to the control signal.

Also, the adjustment circuit may comprise a D/A converter that converts the control signal into the reference voltage in the form of an analog signal.

Also, the adjustment circuit may change a bias current that flows through a differential input stage of the operational amplifier according to the control signal.

Also, the control circuit may comprise: a comparator that compares an output signal of the replica circuit with a threshold voltage that determines a predetermined target range; and a sequencer that sweeps the control signal until a change in an output of the comparator is detected.

Also, when a power supply is turned on for the audio circuit, the calibration circuit may be set to the calibration mode.

Also, the audio circuit may be monolithically integrated on a single semiconductor substrate.

Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants.

Another embodiment of the present invention relates to an electronic device. The electronic device comprises any one of the aforementioned audio circuits.

It is to be noted that any arbitrary combination or rearrangement of the above-described structural components and so forth is effective as and encompassed by the present embodiments. Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not affect the electric connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not affect the electric connection therebetween, in addition to a state in which the member A is directly connected to the member C, or the member B is directly connected to the member C.

Figure 2:
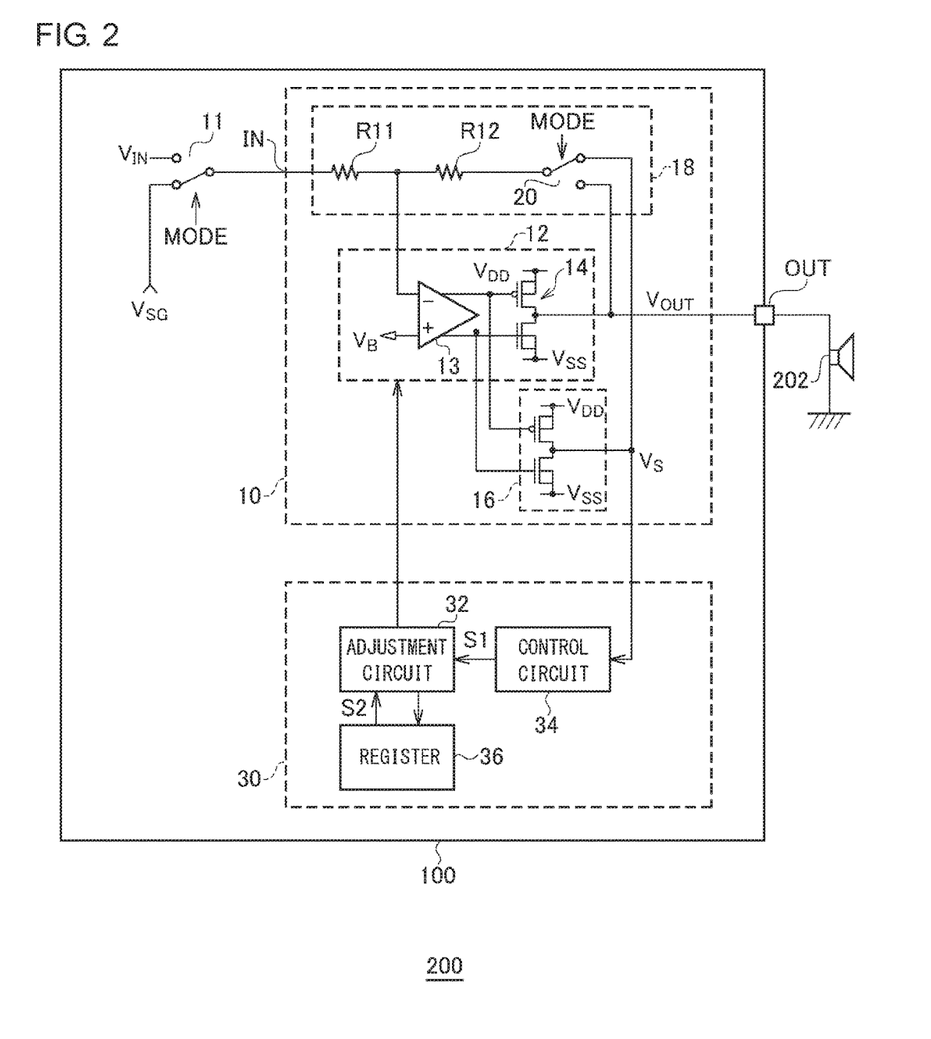
FIG. 2 is a circuit diagram showing an audio system including an audio circuit according to an embodiment.

FIG. 2 is a circuit diagram showing an audio system 200 including an audio circuit 100 according to an embodiment. The audio system 200 includes an electroacoustic conversion element 202 and an audio circuit 100. The electroacoustic conversion element 202 is configured as headphones, speakers, or the like. The audio system 200 is configured as an output coupling capacitor-less circuit. The output (OUT) terminal of the audio circuit 100 is connected to the electroacoustic conversion element 202 without involving a DC block capacitor.

The audio circuit 100 is configured as a function IC (Integrated Circuit) integrated on a single semiconductor substrate. The audio circuit 100 mainly includes an audio amplifier 10 and a calibration circuit 30. In the normal operation, the audio amplifier 10 receives an analog audio signal (which will also be referred to as the "input voltage") $V_{IN}$, amplifies the analog audio signal $V_{IN}$ thus received, and outputs the signal thus amplified to the electroacoustic conversion element 202.

The audio amplifier 10 includes an operational amplifier 12, a replica circuit 16, and a feedback circuit 18. The operational amplifier 12 includes a differential input stage 13 and an output stage 14. In some cases, an amplifier stage is arranged between such components. However, description will be made assuming that such an amplifier stage is not arranged. The replica circuit 16 has the same circuit configuration as that of the output stage 14 of the operational amplifier 12. The replica circuit 16 is designed so as to have a small size in comparison to the output stage 14. The output stage 14 and the replica circuit 16 are preferably arranged in the vicinity of each other on a semiconductor substrate in order to provide high similarity between them as a pair.

In the normal audio playback operation, the audio circuit 100 is set to the normal mode. When the audio amplifier 10 is calibrated, the audio circuit 100 is set to the calibration mode. A mode (MODE) signal shown in FIG. 2 is used as a signal that indicates the mode. Selectors 20 and 11 are each controlled according to the MODE signal.

The audio amplifier 10 is configured: (i) such that, in the operation mode, the output signal $V_{OUT}$ of the operational amplifier 12 is fed back to the input side of the operational amplifier 12; and (ii) such that, in the calibration mode, the output signal (which will also be referred to as the "detection signal") $V_S$ of the replica circuit 16 is fed back to the input side of the operational amplifier 12.

In the present embodiment, the audio amplifier 10 is configured as an inverting amplifier. The feedback circuit 18 includes a selector 20 and resistors R11 and R12. The resistor R11 is arranged between the input terminal IN of the audio amplifier 10 and the inverting input terminal (−) of the operational amplifier 12. The resistor R12 is arranged between the output terminal (OUT) and the inverting input terminal (−) of the operational amplifier 12. A reference voltage $V_B$ is input to the non-inverting input terminal (+) of the operational amplifier 12. In a case of employing an output coupling capacitor-less configuration, there is a need to set the voltage $V_{OUT}$ at the OUT terminal to zero in a silent state. Accordingly, the reference voltage $V_B$ is set such that it matches the DC component of the audio signal $V_{IN}$.

The feedback circuit 18 divides the voltage difference between the output voltage $V_{OUT}$ and the input voltage $V_{IN}$ with a predetermined voltage dividing ratio, and supplies the voltage thus divided to the inverting input terminal of the operational amplifier 12 as a feedback signal. The voltage dividing ratio is determined by the resistors R11 and R12.

For ease of understanding, description will be made in the present embodiment assuming that the audio signal $V_{IN}$ has a DC component of 0 V. In this case, in principle, the reference voltage $V_B$ is set to 0 V. It should be noted that, in the calibration described later, in some cases, the reference voltage $V_B$ is adjusted. In this case, the reference voltage $V_B$ is adjusted in a range including 0 V.

In the calibration mode, the calibration circuit 30 cancels out the offset voltage of the audio amplifier 10. Canceling out the offset voltage of the audio amplifier 10 means that the effect of the offset voltage $V_{OFS}$ of the operational amplifier 12 is removed.

The calibration circuit 30 includes an adjustment circuit 32, a control circuit 34, and a register 36. The adjustment circuit 32 adjusts the offset value of the audio amplifier 10 according to a control signal S1.

In the calibration mode, a predetermined voltage $V_{SG}$ is input to the audio amplifier 10. In the calibration mode, the selector 11 selects the predetermined voltage $V_{SG}$. In the normal mode, the selector 11 selects the audio signal $V_{IN}$. The selector 11 supplies the voltage thus selected to the audio amplifier 10 as an input voltage.

In the calibration mode, the calibration circuit 30 adjusts the control signal S1 such that the detection signal $V_S$, which is an output signal of the replica circuit 16, is within a predetermined target range. The predetermined target range is set based on an ideal value of the detection signal $V_S$ that is expected in a state in which the offset of the audio amplifier 10 is canceled out. Specifically, in a case in which $V_{SG}=0$, the ideal value of the detection signal $V_S$ is 0 V. Accordingly, the target range $V_{TGT}$ is set to a range in the vicinity of 0 V. For example, the control circuit 34 may scan the control signal S1, and may stop scanning when the detection signal $V_S$ becomes a value within the target range $V_{TGT}$.

The register 36 is a memory that stores the control signal S1 acquired in the final stage of the calibration mode. In the normal mode, such a control signal S2 thus stored in the register 36 is input to the adjustment circuit 32.

Figure 3:
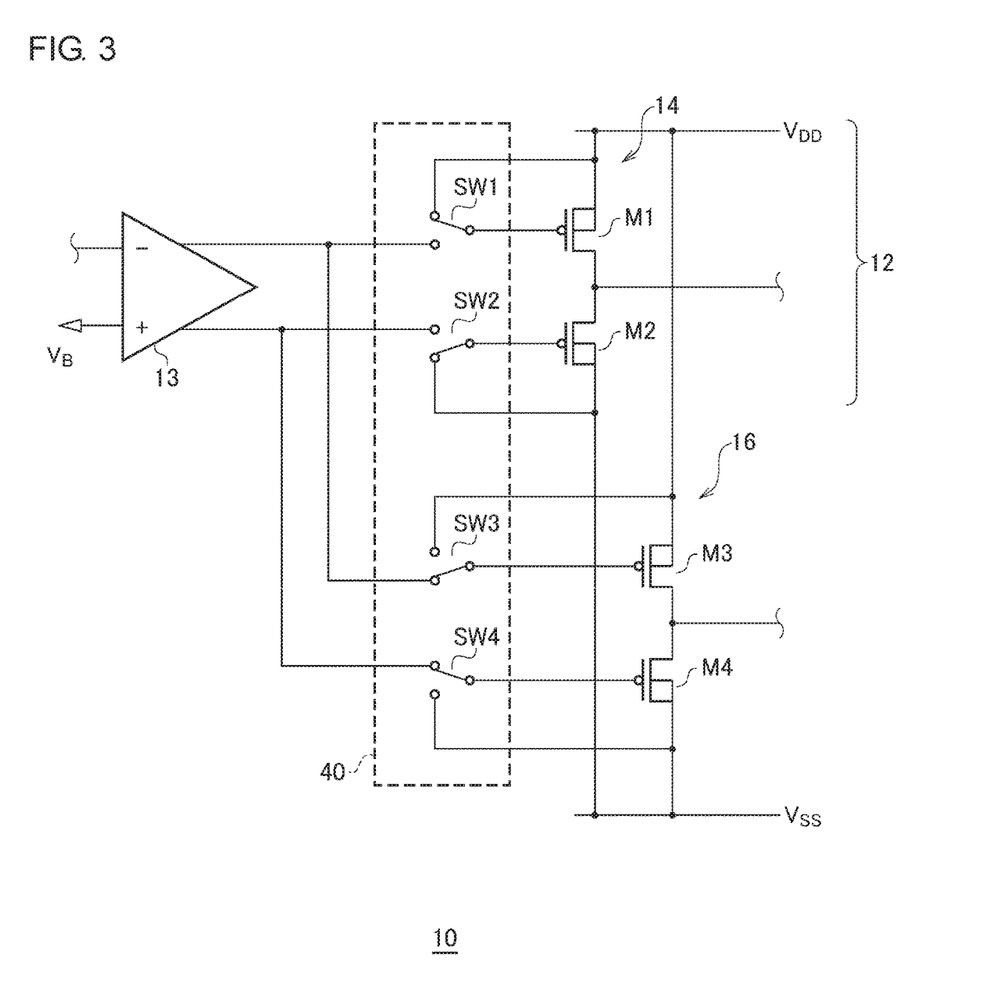
FIG. 3 is a circuit diagram showing a preferable example configuration of an audio amplifier.

FIG. 3 is a circuit diagram showing a preferable example configuration of the audio amplifier 10 shown in FIG. 2. In this example configuration, the audio amplifier 10 further includes a mute circuit 40. In the normal mode, the mute circuit 40 supplies the signal output from the differential input stage 13 to transistors M1 and M2 that form the output stage 14. In this mode, transistors M3 and M4, which form the replica circuit 16, are fixed to the off state. In the calibration mode, the mute circuit 40 fixes the transistors M1 and M2, which form the output stage 14, to the off state. In this mode, the mute circuit 40 supplies the signal output from the differential input stage 13 to the transistors M3 and M4 that form the replica circuit 16.

For example, the mute circuit 40 may include switches SW1 through SW4. The switch SW1 is capable of switching the gate of the transistor M1 between a state in which it is connected to the source of the transistor M1 and a state in which it is connected to the output of the differential input stage 13. The switch SW2 is capable of switching the gate of the transistor M2 between a state in which it is connected to the source of the transistor M2 and a state in which it is connected to the output of the differential input stage 13. The switches SW3 and SW4 perform the same operations as those of the switches SW1 and SW2. By providing the mute circuit 40, such an arrangement is capable of preventing the electroacoustic conversion element 202 from outputting noise.

The configuration of the mute circuit 40 is not restricted to such an arrangement shown in FIG. 3. Rather, various kinds of configurations may be made such that the transistors M1 and M2 that form the output stage 14 do not operate according to the output of the differential input stage 13. Also, the mute circuit 40 may be configured to disconnect the output terminal of the output stage 14 (connection node between the transistors M1 and M2) from the output terminal OUT of the audio amplifier 10 during the calibration mode.

Figure 4:
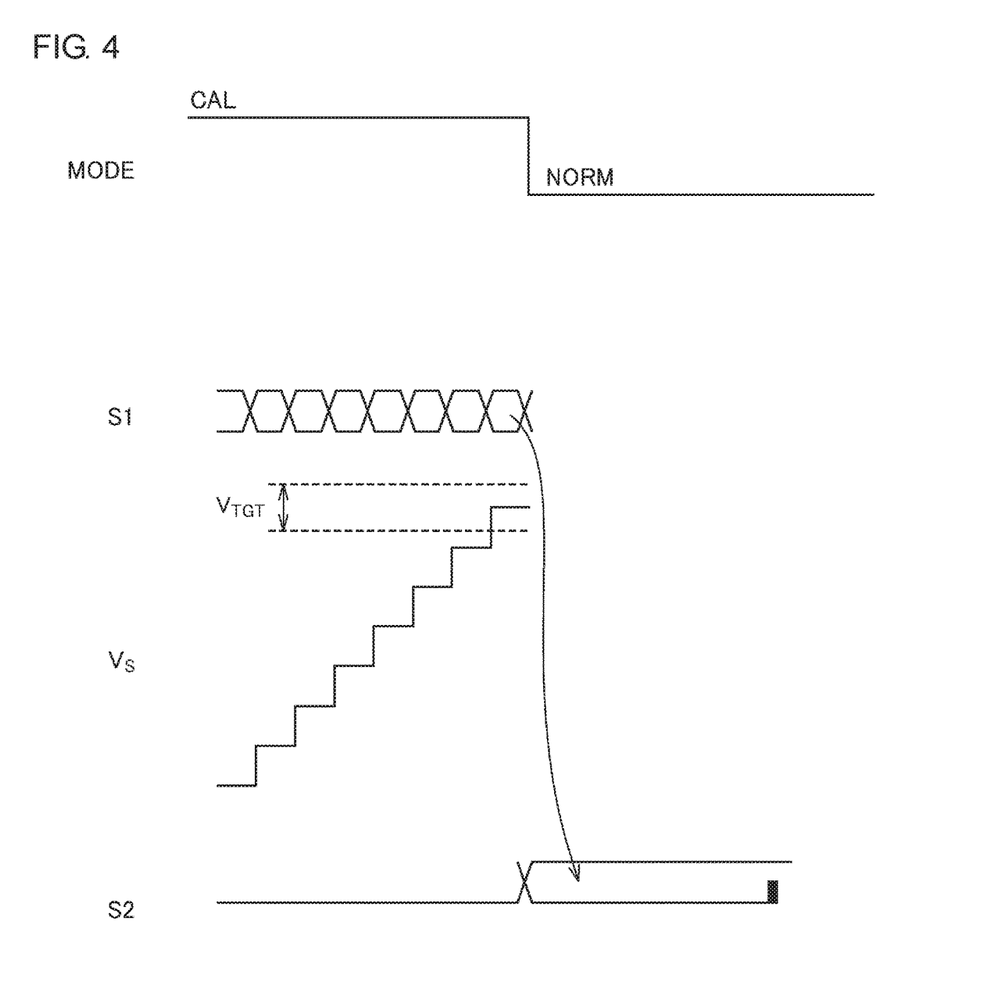
FIG. 4 is an operation waveform diagram showing the operation of an audio circuit shown in FIG. 2 in a calibration mode.

The above is the configuration of the audio circuit 100. Next, description will be made regarding the operation thereof. FIG. 4 is an operation waveform diagram showing the operation of the audio circuit 100 shown in FIG. 2 in the calibration mode. Upon turning on the power supply for the audio circuit 100, the audio circuit 100 is set to the calibration mode. The control circuit 34 changes the value of the control signal S1 in a stepwise manner while monitoring the detection signal $V_S$. In a case in which the control signal S1 is changed in a stepwise manner, the offset value of the audio amplifier 10 changes according to the control signal S1. This changes the detection voltage $V_S$ in a stepwise manner. With such an arrangement, when the detection voltage $V_S$ becomes a value within the target range $V_{TGT}$, the control signal S1 acquired in this stage is stored in the register 36.

When the calibration ends, the audio circuit 100 transits to the normal mode. In the normal mode, the control signal S2 stored in the register 36 is supplied to the adjustment circuit 32. Such an arrangement allows the audio amplifier 10 to start up after the calibration, thereby suppressing pop noise output from the electroacoustic conversion element 202.

The above is the operation of the audio circuit 100.

In typical operational amplifiers, dominant causes of the offset voltage that occurs due to manufacturing variation include element mismatching in the differential input stage 13 and element mismatching in the feedback resister. Conversely, the output stage 14 has almost no effect on the offset voltage. Thus, the detection voltage $V_S$ generated using the replica circuit 16 which is a replica of the output stage 14 has substantially the same offset component as that of the output voltage $V_{OUT}$ generated using the output stage 14.

With the audio circuit 100, the replica circuit 16 is provided as a replica of the output stage 14 of the operational amplifier 12, and the calibration operation is performed using the replica circuit 16. Thus, the output signal $V_{OUT}$ of the output stage 14 does not change in the calibration mode. This allows the audio amplifier 10 to be calibrated while maintaining the electric potential at the OUT terminal, i.e., while preventing the electroacoustic conversion element 202 from generating noise.

Furthermore, the offset voltage of the operational amplifier 12 is not affected by the transistor size of the output stage. In addition, the replica circuit 16 is not required to have a capacity for driving a light load (several to several dozen Ω) such as the electroacoustic conversion element 202. Thus, the replica circuit 16 can be configured to have a sufficiently small circuit size as compared with the output stage 14.

Furthermore, the control circuit 34 can be configured using a simple sequencer (counter) and a voltage comparator circuit. Thus, the control circuit 34 can be configured to have a sufficiently small circuit area. Furthermore, such an arrangement does not require a low-pass filter or the like in order to generate the detection signal $V_S$. Accordingly, the replica circuit 16 and the calibration circuit 30 thus provided requires only a small increase in the circuit area. Thus, such an arrangement provides the calibration function while suppressing an increase in the cost of the audio circuit 100.

In the embodiment, the calibration operation is performed in a state in which the audio circuit 100 is assembled in the form of a set. By performing the calibration operation in such a state in which the audio circuit 100 is assembled in the form of a set, the effect of stress due to packaging and the effect of the power supply voltage can be removed. Thus, such an arrangement is capable of further suppressing pop noise as compared with the offset canceling provided by laser trimming.

The present invention encompasses various kinds of apparatuses and circuits that can be regarded as a block configuration or a circuit configuration shown in FIG. 2, or otherwise that can be derived from the aforementioned description. That is to say, the present invention is not restricted to a specific circuit configuration. More specific description will be made below regarding an example configuration for clarification and ease of understanding of the essence of the present invention and the circuit operation. That is to say, the following description will by no means be intended to restrict the technical scope of the present invention.

Figure 5:
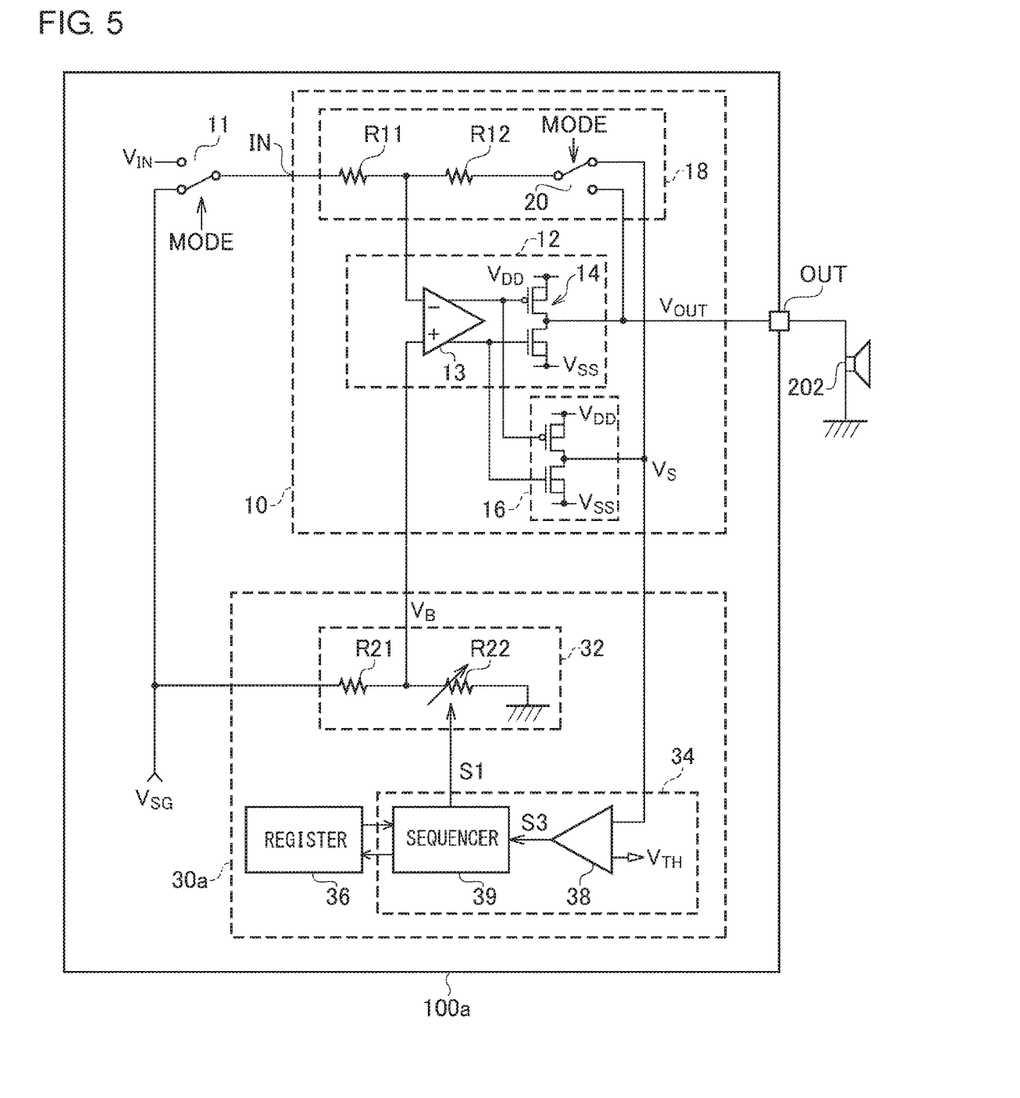
FIG. 5 is a circuit diagram showing a specific example configuration of the audio circuit shown in FIG. 2.
Figure 6:
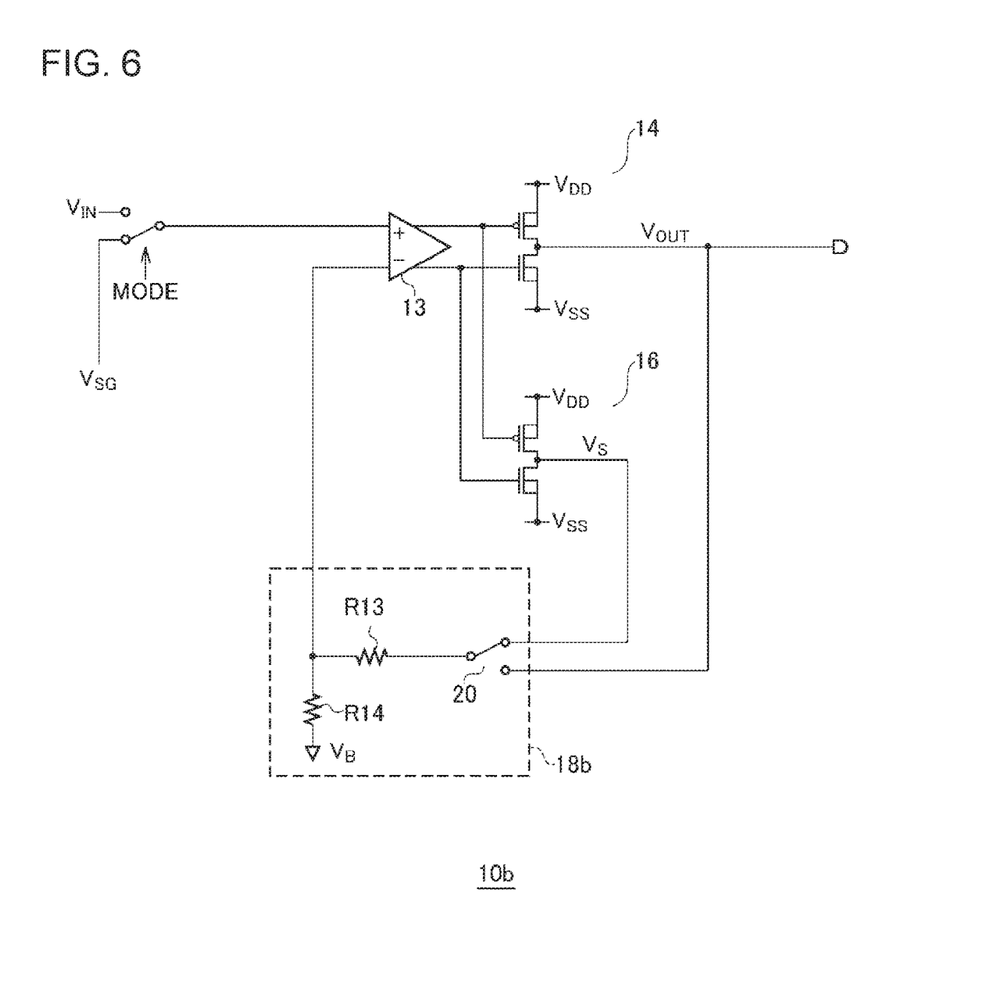
FIG. 6 is a circuit diagram showing an audio amplifier according to a first modification.

FIG. 5 is a circuit diagram showing a specific example configuration 100a of the audio circuit 100 shown in FIG. 2. In the audio circuit 100a, an adjustment circuit 32a adjusts the reference voltage $V_B$ at the non-inverting input terminal of the operational amplifier 12, so as to adjust the offset of the audio amplifier 10. In FIGS. 5 and 6, the mute circuit 40 is preferably provided as an additional component.

For example, the adjustment circuit 32a divides the predetermined voltage $V_{SG}$ so as to generate the reference voltage $V_B$. The adjustment circuit 32a is capable of changing the voltage dividing ratio dividing ratio according to the control signal S1. For example, the adjustment circuit 32a includes resistors R21 and R22, at least one of which is configured as a variable resistor.

The control circuit 34 includes a comparator 38 and a sequencer 39. The comparator 38 compares the detection signal $V_S$ output from the replica circuit 16 with a threshold voltage $V_{TH}$ that determines the predetermined target range $V_{TGT}$. The offset voltage calibration requires the comparator 38 to have high precision on the order of several mV or sub-mV. Accordingly, the comparator 38 is preferably configured as a switched capacitor comparator. Also, the comparator 38 may be configured as a window comparator.

The sequencer 39 sweeps the control signal S1 until a change in an output S3 of the comparator 38 is detected. The resistance value of the resistor R22 is changed according to a change in the control signal S1, which sweeps the reference voltage $V_B$. When the reference voltage $V_B$ matches the input offset voltage of the operational amplifier 12, the detection voltage $V_S$ is within the target range $V_{TGT}$. This changes the output S3 of the comparator 38. When the change in the output S3 is detected, the sequencer 39 stops sweeping, and the value of the control signal S1 acquired in this stage is stored in the register 36. Such an arrangement allows the calibration circuit 30a to have a compact-sized circuit configuration.

Description has been made above regarding the present invention with reference to the embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

[First Modification]

Description has been made in the embodiment regarding an arrangement in which the audio amplifier 10 is configured as an inverting amplifier. Also, the present invention is applicable to a non-inverting amplifier. FIG. 6 is a circuit diagram showing an audio amplifier 10b according to a first modification. A feedback circuit 18b divides a voltage difference between the reference voltage $V_B$ and the output voltage $V_{OUT}$ ($V_S$) of the operational amplifier 12 (or otherwise of the replica circuit 16) with a predetermined voltage dividing ratio, and supplies the voltage thus divided to the non-inverting input terminal of the operational amplifier 12. The feedback circuit 18b may include resistors R13 and R14. The audio amplifier 10b may be configured as a voltage follower (buffer). In this case, the resistor R13 may be short-circuited, and the resistor R14 may be omitted.

In order to change the offset value of the audio amplifier 10b shown in FIG. 6, the adjustment circuit 32 may change the reference voltage $V_B$. The reference voltage $V_B$ may be generated by means of the calibration circuit 30a shown in FIG. 5.

Alternatively, in order to change the offset value of the audio amplifier 10b shown in FIG. 6, at least one of the resistors R13 and R14 may be configured as a variable resistor having a resistance that changes according to the control signal S1.

[Second Modification]

Figure 7A:
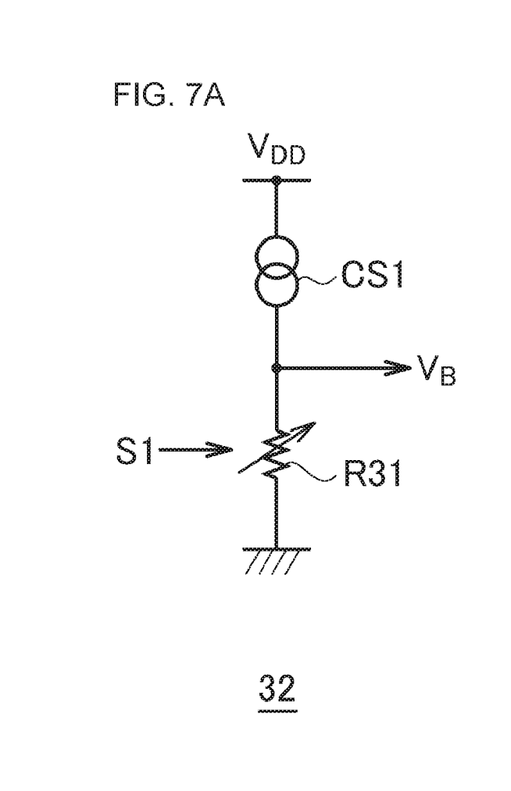
FIGS. 7A through 7C are circuit diagrams each showing a modification of an adjustment circuit shown in FIG. 5.
Figure 7B:
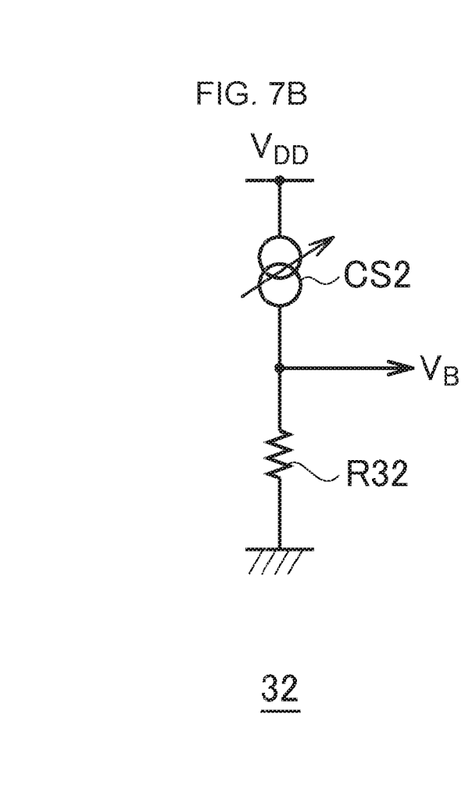
Figure 7C:
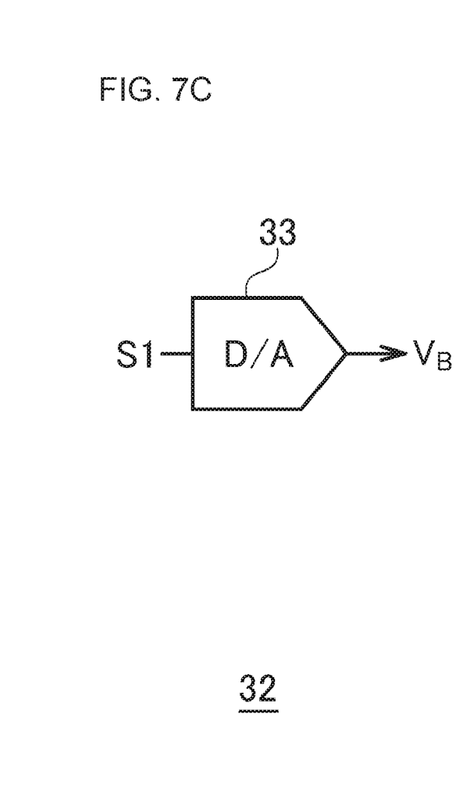

FIGS. 7A through 7C are circuit diagrams each showing a modification of the adjustment circuit 32 shown in FIG. 5. The adjustment circuit 32 shown in FIG. 7A includes a constant current source CS1 and a variable resistor R31. The constant current source CS1 supplies a constant current $I_C$ to the variable resistor R31. The voltage drop provided by the variable resistor R31 is supplied to the audio amplifier 10 as the reference voltage $V_B$.

The adjustment circuit 32 shown in FIG. 7B includes a variable current source CS2 and a fixed resistor R32. The variable current source CS2 supplies a variable current $I_V$ to the fixed resistor R32 according to the control signal S1. The voltage drop provided by the fixed resistor R32 is supplied to the audio amplifier 10 as the reference voltage $V_B$. The variable current source CS2 can be regarded as a current DAC.

The adjustment circuit 32 shown in FIG. 7C includes a D/A converter 33 that converts the control signal S1 into an analog reference voltage $V_B$. The D/A converter 33 broadly falls into the same category as that of the adjustment circuits 32 shown in FIGS. 7A and 7B.

The adjustment circuits 32 shown in FIGS. 7A through 7C may each be combined with the audio amplifier 10b shown in FIG. 6.

[Third Modification]

Figure 8:
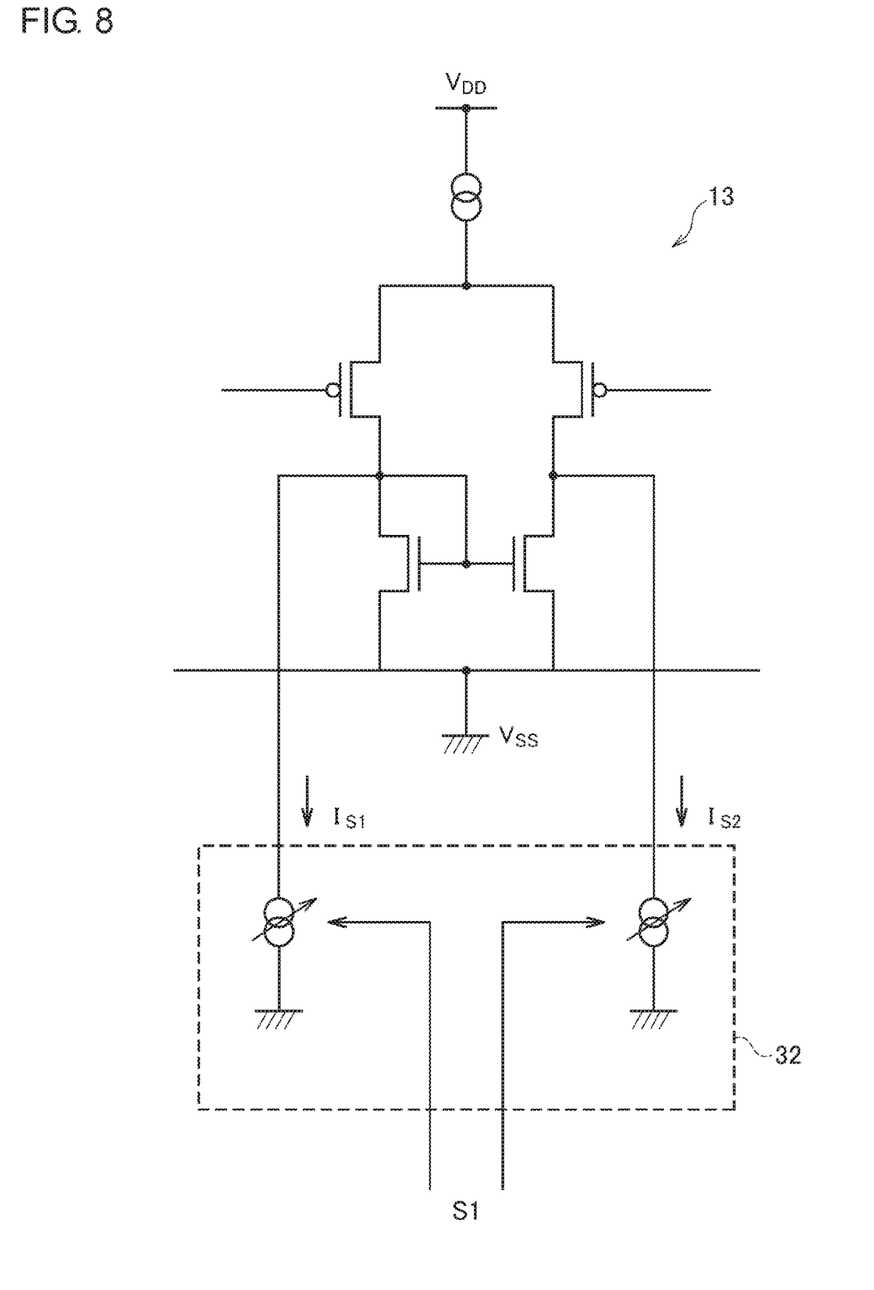
FIG. 8 is a circuit diagram showing another modification of the adjustment circuit.

FIG. 8 is a circuit diagram showing another modification of the adjustment circuit 32. The adjustment circuit 32 changes the bias current that flows through the differential input stage 13 of the operational amplifier 12 according to the control signal S1. The control circuit 34 includes a first current source CS31 and a second current source CS32 each configured as a variable current source. The values of correction currents $I_{S1}$ and $I_{S2}$ generated by the respective current sources can be controlled according to the control signal S1. By appropriately adjusting the correction currents $I_{S1}$ and $I_{S2}$, such an arrangement allows the offset voltage to approach zero. The adjustment circuit 32 shown in FIG. 8 may be combined with the audio amplifier 10b shown in FIG. 6.

[Fourth Modification]

Description has been made in the embodiment regarding an arrangement in which the audio amplifier 10 to be calibrated is configured as a power amplifier arranged as a final stage. However, the present invention is not restricted to such an arrangement. In a case in which a pre-amplifier is arranged as an upstream stage of a power amplifier, the calibration operation may be performed so as to control the offset of the pre-amplifier. Also, in a case in which an analog volume circuit is provided as an upstream stage of a power amplifier, the calibration operation may be performed so as to control the offset of the analog volume circuit. Without going so far as to show a specific circuit diagram, the configuration for calibrating the power amplifier as shown in FIG. 2 can be easily modified for calibrating such a pre-amplifier or an analog volume circuit.

[Fifth Modification]

Description has been made in the embodiment regarding an arrangement in which the audio signal $V_{IN}$ has a DC level of zero. Also, the audio signal $V_{IN}$ may have a DC level that is not equal to zero (e.g., a DC level of half the power supply voltage $V_{DD}$, i.e., $V_{DD}/2$). Also, an output coupling capacitor may be arranged between the OUT terminal of the audio circuit 100 and the electroacoustic conversion element 202.

[Usage]

Figure 9:
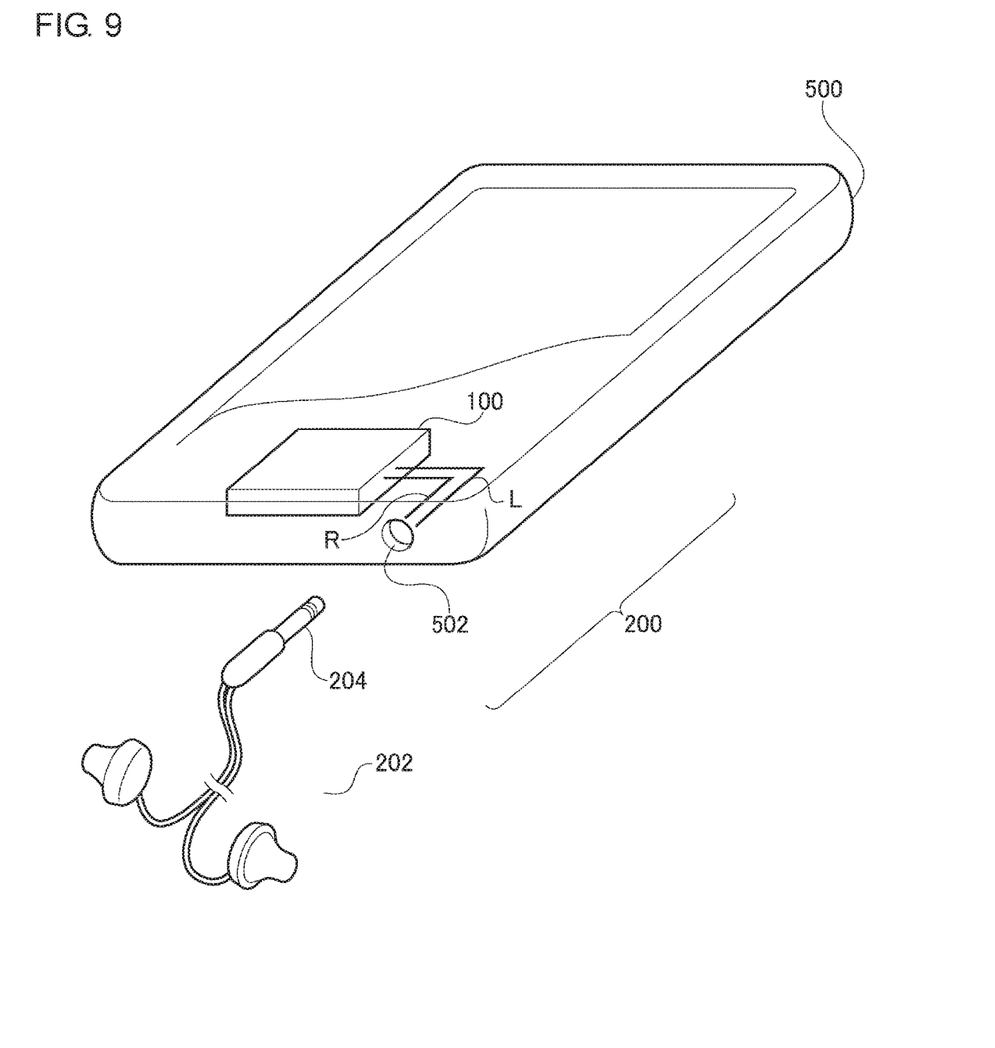
FIG. 9 is a perspective view of an electronic device.

Lastly, description will be made regarding the usage of the audio circuit 100. An audio system 200 employing the audio circuit 100 is preferably employed in various kinds of electronic devices such as portable audio players, smartphones, tablet PCs, and digital still cameras. FIG. 9 is a perspective view of an electronic device 500. The electronic device 500 includes a headphone jack 502. The electronic device 500 is configured to allow a plug 204 of headphones configured as the electroacoustic conversion element 202 to be detachably inserted into the headphone jack 502. The audio circuit 100 is configured as a power amplifier IC that drives the headphones, and is built into the electronic device 500. It should be noted that the audio amplifier 10 of the audio circuit 100 may receive an audio signal $V_{IN}$ from an unshown audio signal processing circuit configured as a different circuit. Also, in addition to the audio amplifier 10 configured as a power amplifier, the audio circuit 100 may include various kinds of analog circuits such as a volume circuit and a pre-amplifier configured as an upstream stage. Furthermore, the audio circuit 100 may include, as a built-in component, a DSP (Digital Signal Processor) that performs various kinds of signal processing on a digital audio signal and a D/A converter that converts a digital audio signal into an analog audio signal.

In addition, the audio circuit 100 is applicable to an in-vehicle audio system, a non-portable audio playback apparatus, and the like.

While the preferred embodiments of the present invention have been described using specific terms, such description is for illustrative purposes only, and it is to be understood that changes and variations may be made without departing from the spirit or scope of the appended claims.

What is claimed is:

1. An audio circuit comprising:
   an audio amplifier that comprises:
      an operational amplifier, having its output stage to be coupled to an electroacoustic conversion element;
      a replica circuit configured as a replica of the output stage of the operational amplifier, wherein an output of the replica circuit is not coupled to the electroacoustic conversion element; and
      a feedback circuit configured such that, in a normal mode, an output signal of the operational amplifier is fed back to an input side of the operational amplifier, and such that, in a calibration mode, an output signal of the replica circuit is fed back to the input side of the operational amplifier; and
   a calibration circuit structured to cancel out an offset voltage of the audio amplifier,
   wherein the calibration circuit comprises:
      an adjustment circuit structured to change an offset of the audio amplifier according to a control signal;
      a control circuit structured to adjust the control signal in the calibration mode such that the output signal of the replica circuit is within a predetermined target range in a state in which a predetermined voltage is input to the audio amplifier; and
      a memory structured to store the control signal finally acquired in the calibration mode,
   and wherein the control signal stored in the memory is supplied to the adjustment circuit in the normal mode.

2. The audio circuit according to claim 1, wherein the audio amplifier is configured as an inverting amplifier,
   and wherein the adjustment circuit changes a reference voltage applied to a non-inverting input terminal of the operational amplifier.

3. The audio amplifier according to claim 1, wherein the audio amplifier is configured as a non-inverting amplifier,
   wherein the feedback circuit divides a voltage difference between a reference voltage and an output signal of the operational amplifier or otherwise the replica circuit with a predetermined voltage dividing ratio, and outputs the voltage thus divided to a non-inverting input terminal of the operational amplifier,
   and wherein the adjustment circuit changes the reference voltage.

4. The audio circuit according to claim 2, wherein the adjustment circuit divides the predetermined voltage so as to generate the reference voltage,
   and wherein the adjustment circuit has a variable voltage dividing ratio that is changed according to the control signal.

5. The audio circuit according to claim 3, wherein the adjustment circuit divides the predetermined voltage so as to generate the reference voltage,
   and wherein the adjustment circuit has a variable voltage dividing ratio that is changed according to the control signal.

6. The audio circuit according to claim 2, wherein the adjustment circuit comprises a D/A converter that converts the control signal into the reference voltage in the form of an analog signal.

7. The audio circuit according to claim 3, wherein the adjustment circuit comprises a D/A converter that converts the control signal into the reference voltage in the form of an analog signal.

8. The audio circuit according to claim 1, wherein the adjustment circuit changes a bias current that flows through a differential input stage of the operational amplifier according to the control signal.

9. The audio circuit according to claim 1, wherein the control circuit comprises:
 a comparator that compares an output signal of the replica circuit with a threshold voltage that determines a predetermined target range; and
 a sequencer that sweeps the control signal until a change in an output of the comparator is detected.

10. The audio circuit according to claim 9, wherein the comparator is configured as a switched capacitor comparator.

11. The audio circuit according to claim 1, wherein, when a power supply is turned on for the audio circuit, the calibration circuit is set to the calibration mode.

12. The audio circuit according to claim 1, wherein the audio amplifier is configured as a power amplifier that drives an electroacoustic conversion element.

13. The audio circuit according to claim 12, wherein an output of the audio amplifier is connected to the electroacoustic conversion element without involving a coupling capacitor.

14. The audio circuit according to claim 1, monolithically integrated on a single semiconductor substrate.

15. An electronic device comprising an audio circuit according to claim 1.

* * * * *